United States Patent
Konno et al.

(10) Patent No.: US 7,378,349 B2
(45) Date of Patent: May 27, 2008

(54) CHEMICAL MECHANICAL POLISHING AQUEOUS DISPERSION AND CHEMICAL MECHANICAL POLISHING METHOD

(75) Inventors: Tomohisa Konno, Chuo-ku (JP); Hirotaka Shida, Chuo-ku (JP); Kiyonobu Kubota, Chuo-ku (JP); Masayuki Hattori, Chuo-ku (JP); Nobuo Kawahashi, Chuo-ku (JP)

(73) Assignee: JSR Corporation, Tokyo (JP)

( * ) Notice: Subject to any disclaimer, the term of this patent is extended or adjusted under 35 U.S.C. 154(b) by 348 days.

(21) Appl. No.: 11/102,639

(22) Filed: Apr. 11, 2005

(65) Prior Publication Data

US 2005/0227451 A1    Oct. 13, 2005

(30) Foreign Application Priority Data

Apr. 12, 2004   (JP)   ............................. 2004-116307
Apr. 12, 2004   (JP)   ............................. 2004-116308

(51) Int. Cl.
   *H01L 21/461* (2006.01)
(52) U.S. Cl. ................. 438/693; 438/690; 257/21.483; 451/57
(58) Field of Classification Search ............... 438/690, 438/693; 451/57; 257/E21.483, E21.484
   See application file for complete search history.

(56) References Cited

U.S. PATENT DOCUMENTS

| 2001/0018270 A1* | 8/2001 | Tsuchiya et al. ............ 438/689 |
| 2001/0051746 A1 | 12/2001 | Hagihara et al. ............ 562/400 |
| 2003/0061766 A1* | 4/2003 | Vogt et al. ................. 51/308 |
| 2004/0010979 A1 | 1/2004 | Oshima et al. ............... 51/307 |
| 2004/0115370 A1* | 6/2004 | Funakoshi et al. .......... 428/32.1 |
| 2006/0117667 A1* | 6/2006 | Siddiqui et al. .............. 51/309 |

FOREIGN PATENT DOCUMENTS

| EP | 1 006 166 A1 | 6/2000 |
| JP | 3-50112 | 3/1991 |
| JP | 8-139092 | 5/1996 |
| JP | 10-310415 | 11/1998 |
| JP | 11-33378 | 2/1999 |
| JP | 11-57521 | 3/1999 |
| JP | 11-147036 | 6/1999 |
| JP | 2000-458 | 1/2000 |
| JP | 2002-270545 | 9/2002 |
| JP | 2003-77920 | 3/2003 |

\* cited by examiner

*Primary Examiner*—Caridad M. Everhart
(74) *Attorney, Agent, or Firm*—Oblon, Spivak, McClelland, Maier & Neustadt, P.C.

(57) ABSTRACT

Disclosed is a chemical mechanical polishing aqueous dispersion comprising (A1) first fumed silica having a specific surface area of not less than 10 $m^2/g$ and less than 160 $m^2/g$ and an average secondary particle diameter of not less than 170 nm and not more than 250 nm and (A2) second fumed silica having a specific surface area of not less than 160 $m^2/g$ and an average secondary particle diameter of not less than 50 nm and less than 170 nm. Also disclosed is a chemical mechanical polishing method using the chemical mechanical polishing aqueous dispersion. According to the chemical mechanical polishing aqueous dispersion and the chemical mechanical polishing method, a chemical mechanical polishing process wherein a barrier metal layer and a cap layer can be efficiently removed by polishing and damage to an insulating film material of a low dielectric constant present in the underlying layer is reduced can be carried out.

8 Claims, 2 Drawing Sheets

CHEMICAL MECHANICAL POLISHING AQUEOUS DISPERSION AND CHEMICAL MECHANICAL POLISHING METHOD

FIELD OF THE INVENTION

The present invention relates to a chemical mechanical polishing aqueous dispersion and a cheical mechanical polishing method using the same.

BACKGROUND OF THE INVENTION

As interlayer insulating films in semiconductor elements or the like, silicon oxide films ($SiO_2$ films) formed by a vacuum process such as CVD (chemical vapor deposition) process have been heretofore used frequently, but these $SiO_2$ films have high dielectric constant of about 4.

In recent years, lowering of dielectric constant of the interlayer insulating films for the purposes of fining VLSI elements and saving power consumption has been paid attention. Such insulating film materials of low dielectric constant exhibit dielectric constant of about 2.2 to 3.5, and they are expected to contribute to enhancement of performance of semiconductor elements. However, they have lower mechanical strength than the heretofore known silicon oxide films formed by a vacuum process and have an elastic modulus, as measured by nanoindentention method, of about 1 to 2.0 GMPa.

By the way, in order to form Damascene interconnect, a process comprising depositing a metal that becomes a interconnect material on an insulating layer having a trench at the place where a interconnect should be arranged and then removing an excess metal material by chemical mechanical polishing is usually employed. For the purpose of preventing metal atoms (e.g., copper atoms) constituting the metal material that is interconnect material from diffusing into the insulating layer, a barrier metal layer is formed between the insulating layer and the metal layer that becomes a interconnect material (see, for example, patent document 1). As a material of the barrier metal layer, a metal having high hardness, such as tantalum, tantalum nitride, titanium or titanium nitride, is usually employed. In the case where such a barrier metal layer is formed, an excess metal material is removed by chemical mechanical polishing and then the barrier metal layer is further removed, whereby Damascene interconnect is formed.

If an insulating film material of a low dielectric constant and a barrier metal are both adopted in order to enhance performance of a semiconductor element or the like, the insulating film material of a low dielectric constant and low mechanical strength that is present in the underlying layer suffers damage such as occurrence of a large number of scratches (scratchy surface defects) or excessive polishing, resulting in a problem that no favorable Damascene interconnect is obtained.

In order to solve such a problem, it has been proposed to form a stronger insulating layer between the insulating film of a low dielectric constant and the barrier metal layer to reduce damage of the insulating layer of a low dielectric constant (see, for example, patent document 2). The stronger insulating layer formed for this purpose is referred to as a "cap layer".

In the case where the cap layer is formed as above, the excess metal material and the barrier metal layer are removed by chemical mechanical polishing and then the cap layer is further removed in the chemical mechanical polishing process in the production of a semiconductor element, whereby Damascene interconnect is formed.

Since removal of the excess metal material takes a longest time, this removal process is sometimes separated and carried out as a different process to increase throughput. In such a case, after the excess metal material is removed, removal of the barrier metal layer and removal of the cap layer are carried out as one process or carried out separately as different processes.

In the former case, there is required a chemical mechanical polishing process wherein the barrier metal layer and the cap layer can be efficiently removed by polishing and damage to the insulating film material of a low dielectric constant present in the underlying layer is reduced. In the latter case, there is required a chemical mechanical polishing process wherein the cap layer can be efficiently removed by polishing and damage to the insulating film material of a low dielectric constant present in the underlying layer is reduced.

In order to meet the above requirements, it has been proposed to use colloidal silica having uniform particle diameters as a chemical mechanical polishing aqueous dispersion for use in the chemical mechanical polishing process to remove the barrier metal layer or the cap layer (see, for example, patent document 3). In this method, however, removal rates for the barrier metal, the cap layer and the insulating layer of a low dielectric constant are badly balanced, so that the insulating layer of a low dielectric constant is excessively polished, and as a result, many scratches sometimes occur on the insulating layer.

Further, a method of using a pad of low hardness as a polishing pad and a method of polishing under the conditions of low head pressure in the polishing process have been studied. In these methods, however, the removal rate for the barrier metal is insufficient.

As described above, a chemical mechanical polishing process wherein a barrier metal layer and a cap layer can be efficiently removed by polishing and damage to an insulating film material of a low dielectric constant present in the underlying layer is reduced, and a chemical mechanical polishing aqueous dispersion used for the process have not been proposed yet.

Patent document 1: Japanese Patent Laid-Open Publication No. 139092/1996
Patent document 2: Japanese Patent Laid-Open Publication No. 77920/2003
Patent document 3: Japanese Patent Laid-Open Publication No. 270545/2002

OBJECT OF THE INVENTION

It is an object of the present invention to provide a chemical mechanical polishing aqueous dispersion capable of carrying out a chemical mechanical polishing process wherein a barrier metal layer and a cap layer can be efficiently removed by polishing and damage to an insulating film material of a low dielectric constant present in the underlying layer is reduced, and a chemical mechanical polishing method using the chemical mechanical polishing aqueous dispersion.

SUMMARY OF THE INVENTION

The object of the present invention is achieved first by a chemical mechanical polishing aqueous dispersion comprising (A1) first fumed silica having a specific surface area of not less than 10 $m^2/g$ and less than 160 $m^2/g$ and an average secondary particle diameter of not less than 170 nm and not more than 250 nm and (A2) second fumed silica having a specific surface area of not less than 160 m²/g and an average secondary particle diameter of not less than 50 nm and less than 170 nm, said aqueous dispersion having pH of not less than 3 and not more than 12.

The object of the present invention is achieved secondly by a chemical mechanical polishing method comprising chemically and mechanically polishing a polishing target by the use of the above-mentioned chemical mechanical polishing aqueous dispersion, said polishing target having a metal layer that is a interconnect material, an insulating layer having an elastic modulus, as measured by nanoindentention method, of not less than 20 Gpa and an insulating layer having an elastic modulus, as measured by nanoindentention method, of not less than 1 GPa and less than 20 Gpa and further having a barrier metal layer when needed.

DETAILED DESCRIPTION OF THE INVENTION

Figure 1:
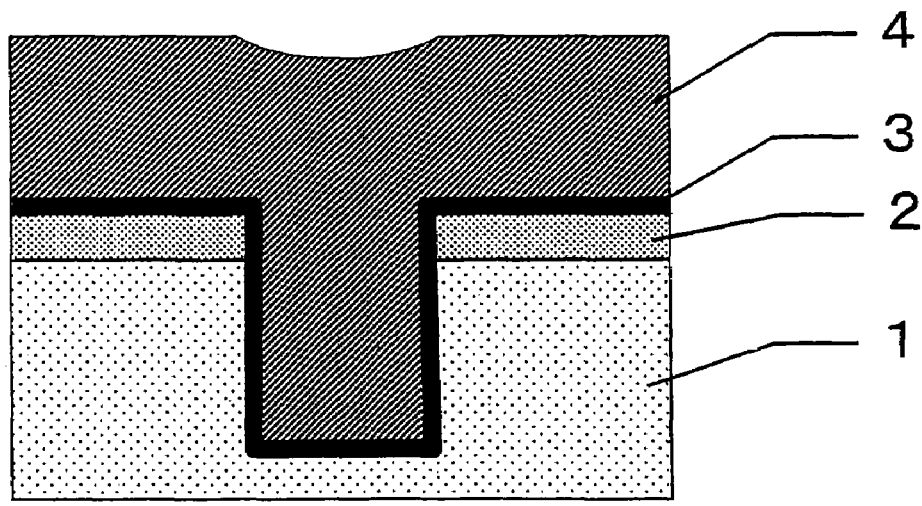
FIG. 1 is a schematic view of a polishing target before removal of an excess metal layer.

The chemical mechanical polishing aqueous dispersion of the invention comprises (A1) first fumed silica having a specific surface area of not less than 10 m²/g and less than 160 m²/g and an average secondary particle diameter of not less than 170 nm and not more than 250 nm and (A2) second fumed silica having a specific surface area of not less than 160 m²/g and an average secondary particle diameter of not less than 50 nm and less than 170 nm.

The first fumed silica (A1) and the second fumed silica (A2) are each obtained by heat treating a silicon compound that is a silica precursor in the presence of oxygen and hydrogen. Examples of the silicon compounds as silica precursors include silicon tetrachloride, trichlorosilane and dichlorosilane. The fumed silica is obtained in the form of secondary particles which are agglomerates of primary particles, and it is very difficult to disperse the fumed silica in the state of primary particles, so that the fumed silica is generally present as secondary particles in an aqueous dispersion. Therefore, if a secondary particle diameter and a specific surface area that is regarded as an indication of a primary particle diameter are defined, the fumed silica can be sufficiently specified.

The first fumed silica (A1) contained in the chemical mechanical polishing aqueous dispersion of the invention has a specific surface area, as measured by BET method using nitrogen as an adsorbent, of not less than 10 m²/g and less than 160 m²/g, preferably not less than 50 m²/g and not more than 150 m²/g, more preferably not less than 75 m²/g and not more than 100 m²/g. The first fumed silica (A1) has an average secondary particle diameter of not less than 170 nm and not more than 250 nm, preferably not less than 200 nm and not more than 230 nm.

The second fumed silica (A2) contained in the chemical mechanical polishing aqueous dispersion of the invention has a specific surface area, as measured by BET method using nitrogen as an adsorbent, of not less than 160 m²/g, preferably not less than 160 m²/g and not more than 350 m²/g, more preferably not less than 200 m²/g and not more than 300 m²/g. The second fumed silica (A2) has an average secondary particle diameter of not less than 50 nm and less than 170 nm, preferably not less than 100 nm and not more than 150 nm.

The average secondary particle diameter of the fumed silica is measured by laser scattering diffraction method.

The total amount of the first fumed silica (A1) and the second fumed silica (A2) used in the chemical mechanical polishing aqueous dispersion of the invention is in the range of preferably 0.5 to 20% by weight, more preferably 1 to 15% by weight, particularly preferably 5 to 10% by weight, based on the whole amount of the chemical mechanical polishing aqueous dispersion. When the total amount is in the above range, a chemical mechanical polishing aqueous dispersion exhibiting satisfactory removal rates can be obtained.

The ratio by weight between the amount of the first fumed silica (A1) and the amount of the second fumed silica (A2) used (first fumed silica (A1):second fumed silica (A2)) is in the range of preferably 1:2 to 5:1, more preferably 1:2 to 3:1, still more preferably 1:2 to 2:1. When the ratio therebetween is in the above range, a chemical mechanical polishing aqueous dispersion having an excellent balance among the removal rates for the barrier metal layer, the insulating layer having an elastic modulus, as measured by nanoindentention method, of not less than 1 GPa and less than 20 Gpa and the insulating layer having an elastic modulus, as measured by nanoindentention method, of not less than 20 Gpa can be obtained.

For dispersing the first fumed silica (A1) and the second fumed silica (A2) in an aqueous medium, publicly known methods can be employed. For example, dispersing methods disclosed in Japanese Patent Laid-Open Publication No. 50112/1991, Japanese Patent Laid-Open Publication No. 310415/1998, Japanese Patent Laid-Open Publication No. 33378/1999, Japanese Patent Laid-Open Publication No. 57521/1999, Japanese Patent Laid-Open Publication No. 147036/1999 and Japanese Patent Laid-Open Publication No. 458/2000, and a method disclosed in Nippon Aerosil Co., Ltd. Technical Bulletin No. 19 "Handling of Aerosil" can be adopted.

In the chemical mechanical polishing aqueous dispersion of the invention, the first fumed silica (A1) and the second fumed silica (A2) are contained as essential components, and in addition thereto, there can be further added at least one component of (A3) abrasive grains other than the first fumed silica and the second fumed silica, (B) an oxidizing agent, (C) an organic acid, (D) at least one compound selected from the group consisting of benzotriazole, a benzotriazole derivative, quinolinecarboxylic acid, a quinolinecarboxylic acid derivative, pyridinecarboxylic acid and a pyridinecarboxylic acid derivative, and (E) a surface active agent.

The abrasive grains (A3) other than the first fumed silica and the second fumed silica, which can be further added to the chemical mechanical polishing aqueous dispersion of the invention, are for example inorganic particles other than fumed silica, organic particles or organic-inorganic composite particles.

The inorganic particles other than fumed silica can be added in order to improve removal rates.

Examples of the inorganic particles other than fumed silica include particles of inorganic compounds such as alumina, ceria, titania, zirconia, silicon carbide and silicon nitride, and colloidal silica.

The inorganic particles other than fumed silica have an average particle diameter of preferably 1 to 1000 nm, more preferably 5 to 500 nm, still more preferably 10 to 300 nm.

The organic particles can be added in order to reduce occurrence of scratches or the like on the polished surface.

The organic particles are, for example, organic polymer particles. Examples of the organic polymer particles include particles of thermoplastic resins such as a styrene (co) polymer, a (meth)acrylate (co)polymer and an olefin (co) polymer.

Examples of the styrene (co)polymers include polystyrene, a styrene/1,3-butadiene copolymer and a styrene/isoprene copolymer.

Examples of the (meth)acrylate (co)polymers include polymethyl (meth)acrylate, a methyl (meth)acrylate/vinylpyridine copolymer and a methyl (meth)acrylate/methoxypolyethylene glycol methacrylate/vinylpyridine copolymer.

Examples of the olefin (co)polymers include polyethylene, polypropylene, poly-1-butene, poly-4-methyl-1-pentene and an ethylene/propylene copolymer.

Examples of other thermoplastic resins include polyvinyl ester and polyvinyl chloride.

Such organic polymer particles can be used as particles of a crosslinked polymer obtained by changing a part of the copolymerization component (monomer) to a monomer having two or more double bonds such as divinylbenzene.

The organic particles have an average particle diameter of preferably 10 to 1000 nm, more preferably 50 to 500 nm, still more preferably 50 to 300 nm.

The organic-inorganic composite particles can be added in order to reduce occurrence of scratches or the like on the polished surface.

The organic-inorganic composite particles are particles wherein an inorganic particle and an organic particle are united to each other. Examples of the inorganic particles include the first fumed silica (A1), the second fumed silica (A2) and inorganic particles other than fumed silica. Examples of the organic particles include the above-exemplified organic particles. The organic particles may be those whose surfaces have been reacted with silicon alkoxide or metal alkoxide. Examples of the metal alkoxides include aluminum alkoxide and titanium alkoxide.

In the organic-inorganic composite particles, the inorganic particle and the organic particle have only to be combined integrally to such en extent that they are not separated from each other in the chemical mechanical polishing process. Although the mode to combine those particles is not specifically restricted, there can be mentioned (1) organic-inorganic composite particles wherein an inorganic particle and an organic particle are bonded by electrostatic force, (2) organic-inorganic composite particles wherein an organic particle and an inorganic particle are chemically bonded through a bond group derived from silicon alkoxide or metal alkoxide, (3) organic-inorganic composite particles wherein a surface of an organic particle has been reacted with silicon alkoxide or metal alkoxide and an inorganic particle is physically held by a residue derived from the silicon alkoxide or the metal alkoxide, and (4) organic-inorganic composite particles formed by polycondensing silicon alkoxide or metal alkoxide on a surface of an organic particle.

The compositional ratio between the organic particles and the inorganic particles in the organic-inorganic composite particles is as follows. The amount of the inorganic particles is in the range of preferably 10 to 1000 parts by weight, more preferably 10 to 500 parts by weight, based on 100 parts by weight of the organic particles The organic-inorganic composite particles have an average particle diameter of preferably 50 to 1000 nm, more preferably 100 to 500 nm.

The term "average particle diameter" of the abrasive grains (A3) other than the first fumed silica and the second fumed silica means an average diameter of particles (grains) each behaving as one particle (grain) when the abrasive grains are dispersed in an aqueous dispersion.

When the abrasive grains (A3) other than the first fumed silica and the second fumed silica are used in the chemical mechanical polishing aqueous dispersion of the invention, the amount of the abrasive grains (A3) added is preferably not more than 1000 parts by weight, more preferably not more than 500 parts by weight, particularly preferably not more than 100 parts by weight, based on the total 100 parts by weight of the first fumed silica (A1) and the second fumed silica (A2). When the abrasive grains (A3) are used in the above amount, the surface profile of the polished surface can be effectively improved without lowering the effect of the present invention.

To the chemical mechanical polishing aqueous dispersion of the invention, (B) an oxidizing agent can be further added in order to improve removal rates.

The oxidizing agent which can be added to the chemical mechanical polishing aqueous dispersion of the invention is, for example, hydrogen peroxide, persulfate, inorganic acid having oxidizability, organic peroxide or polyvalent metal salt.

Examples of the persulfates include potassium persulfate and ammonium persulfate.

Examples of the inorganic acids having oxidizability include nitric acid and sulfuric acid.

Examples of the organic peroxides include peracetic acid, perbenzoic acid, tert-butyl hydroperoxide and dicumyl peroxide.

Examples of the polyvalent metal salts include a permanganic acid compound and a bichromic acid compound. The permanganic acid compound is, for example, potassium permanganate. The bichromic acid compound is, for example, potassium bichromate.

Of these, preferable are hydrogen peroxide, persulfate and inorganic acid having oxidizability.

The amount of the oxidizing agent added is preferably not more than 10% by weight, more preferably 0.01 to 10% by weight, still more preferably 0.1 to 3% by weight, particularly preferably 0.1 to 1% by weight, based on the whole amount of the chemical mechanical polishing aqueous dispersion. When the amount of the oxidizing agent is in the above range, removal rates can be efficiently improved without doing excessive damage to the polished surface.

To the chemical mechanical polishing aqueous dispersion of the invention, (C) an organic acid (except carboxylic acid having benzotriazole skeleton, quinoline skeleton or pyridine skeleton) can be further added in order to improve removal rates.

The organic acid (C) is, for example, an aliphatic saturated carboxylic acid, an aliphatic unsaturated carboxylic acid, an aromatic carboxylic acid or a hydroxy acid.

Examples of the aliphatic saturated carboxylic acids include formic acid, acetic acid, butyric acid, oxalic acid, malonic acid, succinic acid, glutaric acid and adipic acid.

Examples of the aliphatic unsaturated carboxylic acids include maleic acid and fumaric acid. Examples of the aromatic carboxylic acids include benzoic acid and phthalic acid. Examples of the hydroxy acids include lactic acid, malic acid, tartaric acid and citric acid.

Of the above organic acids, preferable are malonic acid, succinic acid, maleic acid, lactic acid and citric acid.

The amount of the organic acid (C) added is preferably not more than 5% by weight, more preferably 0.01 to 5% by weight, particularly preferably 0.1 to 1% by weight, based on the whole amount of the chemical mechanical polishing aqueous dispersion. When the amount of the organic acid is in the above range, removal rates can be effectively improved.

To the chemical mechanical polishing aqueous dispersion of the invention, (D) at least one compound selected from the group consisting of benzotriazole, a benzotriazole derivative, quinolinecarboxylic acid, a quinolinecarboxylic acid derivative, pyridinecarboxylic acid and a pyridinecarboxylic acid derivative can be further added in order to improve a removal rate for polishing a metal layer (particularly copper layer) that is a interconnect material.

Examples of the benzotriazole derivatives include methylbenzotriazole, 4-carboxybenzotriazole, 7-carboxybenzotriazole and its salt, benzotriazole butyl ester, 1-hydroxymethylbenzotriazole, 1-hydroxybenzotriazole, 1-(2,3-dihydroxypropyl)-benzotriazole, 1-(2-hydroxyethyl)-benzotriazole, 2-(benzotriazinyl)-ethanesulfonic acid and its salt, and 1-(2-ethylhexylaminomethyl)-benzotriazole.

Examples of the quinolinecarboxylic acid derivatives include substituted compounds wherein one or more hydrogen atoms other than hydrogen atoms constituting carboxyl groups in quinolinecarboxylic acid are replaced with hydroxyl groups, halogen atoms or the like.

Examples of the pyridinecarboxylic acid derivatives include substituted compounds wherein one or more hydrogen atoms other than hydrogen atoms constituting carboxyl groups in pyridinecarboxylic acid are replaced with hydroxyl groups, halogen atoms or the like.

Of these, preferable are benzotriazole, methylbenzotriazole, 4-carboxybenzotriazole, 7-carboxybenzotriazole, benzotriazole butyl ester, 1-hydroxymethylbenzotriazole, 1-hydroxybenzotriazole, quinolinecarboxylic acid and pyridinecarboxylic acid, and particularly preferable are benzotriazole, 2-quinolinecarboxylic acid (quinaldinic acid) and 2,3-pyridinedicarboxylic acid (quinolinic acid).

The above-mentioned at least one compound (D) selected from the group consisting of benzotriazole, a benzotriazole derivative, quinolinecarboxylic acid, a quinolinecarboxylic acid derivative, pyridinecarboxylic acid and a pyridinecarboxylic acid derivative may be used in the form of a salt such as a potassium salt or an ammonium salt.

When the component (D) is benzotriazole or a benzotriazole derivative, the amount of the component (D) added is in the range of preferably 0.0001 to 0.1% by weight, more preferably 0.0005 to 0.01% by weight, based on the whole amount of the chemical mechanical polishing aqueous dispersion. When the component (D) is a pyridinecarboxylic acid derivative, the amount of the component (D) added is in the range of preferably 0.01 to 5% by weight, more preferably 0.005 to 1% by weight, based on the whole amount of the chemical mechanical polishing aqueous dispersion.

To the chemical mechanical polishing aqueous dispersion of the invention, (E) a surface active agent can be further added for the purpose of controlling removal rates or decreasing scratches.

As the surface active agent (E), any of a cationic surface active agent, an anionic surface active agent and a nonionic surface active agent can be employed. However, preferable is an anionic surface active agent or a nonionic surface active agent.

As the anionic surface active agent, for example, carboxylate, sulfonate, sulfuric ester salt or phosphoric ester salt is employable. Examples of the carboxylates include fatty acid soap and alkyl ether carboxylate. Examples of the sulfonates include alkylbenzenesulfonate, alkylnaphthalenesulfonate and α-olefin sulfonate. Examples of the sulfuric ester salts include higher alcohol sulfuric ester salt, alkyl ether sulfate and polyoxyethylenealkylphenyl ether sulfate. Examples of the phosphoric ester salts include alkylphosphoric ester salt.

Of the anionic surface active agents, preferable are sulfonates, more preferable are alkylbenzenesulfonates, and particularly preferable is potassium dodecylbenzenesulfonate.

Preferred examples of the nonionic surface active agents include ether type surface active agents, such as polyoxyethylene alkyl ether, ester ether type surface active agents, such as polyoxyethylene ether of glycerol ester, and ester type surface active agents, such as polyethylene glycol fatty acid ester, glycerol ester and sorbitan ester.

The amount of the surface active agent added is preferably not more than 1% by weight, more preferably not more than 0.5% by weight, particularly preferably not more than 0.1% by weight, based on the whole amount of the chemical mechanical polishing aqueous dispersion.

When the amount of the surface active agent is in the above range, a chemical mechanical polishing aqueous dispersion well balanced between removal rates and an effect of decreasing scratches can be obtained.

In the chemical mechanical polishing aqueous dispersion of the invention, the first fumed silica (A1) and the second fumed silica (A2) are contained as essential components, and at least one component of (A3) the abrasive grains other than the first fumed silica and the second fumed silica, (B) the oxidizing agent, (C) the organic acid, (D) at least one compound selected from the group consisting of benzotriazole, a benzotriazole derivative, quinolinecarboxylic acid, a quinolinecarboxylic acid derivative, pyridinecarboxylic acid and a pyridinecarboxylic acid derivative and (E) the surface active agent is further contained. These components are dissolved or dispersed in an aqueous medium.

The aqueous medium employable in the chemical mechanical polishing aqueous dispersion of the invention is, for example, water or a mixed medium of water and an alcohol. Examples of the alcohols include methanol and ethanol. As the aqueous medium, water is preferable.

The chemical mechanical polishing aqueous dispersion of the invention has pH of preferably 3 to 13, more preferably 5 to 12, particularly preferably 9 to 12. When the pH is in this region, a chemical mechanical polishing aqueous dispersion capable of exhibiting satisfactory removal rates for polishing a barrier metal and a cap layer and capable of inhibiting occurrence of surface defects such as scratches without excessive polishing even if a brittle insulating film of a low dielectric constant is polished can be obtained.

Adjustment of pH can be carried out by not only a means of adding a proper amount of the aforesaid inorganic acid or organic acid but also a means of adding a proper amount of an appropriate basic substance.

As the basic substance, a hydroxide of an alkali metal, ammonia or the like is employable. Examples of hydroxides of alkali metals include sodium hydroxide, potassium hydroxide, rubidium hydroxide and cesium hydroxide.

A ratio ($R_{In}/R_{Low-k}$) of a removal rate ($R_{In}$) of the chemical mechanical polishing aqueous dispersion of the invention to polish an insulating layer having an elastic modulus, as measured by nanoindentention method, of not less than 20 GPa to a removal rate ($R_{Low-k}$) thereof to polish an insulating layer having an elastic modulus, as measured by nanoindentention-method, of not less than 1 GPa and less than 20 GPa can exceed preferably 1, more preferably 5, still more preferably 10.

Further, in the case where a barrier metal layer, an insulating layer having an elastic modulus, as measured by nanoindentention method, of not less than 20 GPa and an insulating layer having an elastic modulus, as measured by nanoindentention method, of not less than 1 GPa and less than 20 GPa are each subjected to chemical mechanical polishing by the use of the chemical mechanical polishing aqueous dispersion of the invention under the same conditions, a ratio ($R_{BM}/R_{Low-k}$) of a removal rate ($R_{BM}$) for polishing the barrier metal layer to a removal rate ($R_{Low-k}$) for polishing the insulating layer having an elastic modulus, as measured by nanoindentention method, of not less than 1 GPa and less than 20 GPa can exceed preferably 1, more preferably 5, still more preferably 10. It is particularly preferable that the ratio ($R_{BM}/R_{Low-k}$) and the ratio ($R_{In}/R_{Low-k}$) satisfy the above requirements at the same time.

As the "same conditions" to evaluate the removal rate ratio, for example, the following conditions are adoptable.

Table rotation speed: 70 rpm
Head rotation speed: 70 rpm
Head load: 250 g/cm$^2$
Feed rate of polishing aqueous dispersion: 300 ml/min The chemical mechanical polishing method of the invention can be carried out using the above-described chemical mechanical polishing aqueous dispersion of the invention and using a commercially available chemical mechanical polishing apparatus (e.g., LGP510 and LGP552 (manufactured by Lapmaster SFT Corp.), EPO-113 and EPO-222 (manufactured by Ebara Corporation), Mirra (manufactured by Applied Materials Inc.), AVANTI-472 (manufactured by SpeedFam-IPEC)) under the conventional polishing conditions.

As the polishing conditions, for example, the following conditions are adoptable.

The table rotation speed is in the range of preferably 30 to 120 rpm, more preferably 40 to 100 rpm.

The head rotation speed is in the range of preferably 30 to 120 rpm, more preferably 40 to 100 rpm.

The ratio of table rotation speed/head rotation speed is in the range of preferably 0.5 to 2, more preferably 0.7 to 1.5.

The polishing pressure is in the range of preferably 100 to 500 g/cm$^2$, more preferably 200 to 350 g/cm$^2$.

The feed rate of the polishing aqueous dispersion is in the range of 50 to 300 ml/min, more preferably 100 to 200 ml/min.

It is preferable to remove abrasive grains remaining on the polished surface after the chemical mechanical polishing is completed. Removal of the abrasive grains can be carried out by a usual cleaning method. For example, the abrasive grains adhering to the polished surface can be removed by performing brush scrub cleaning and then performing cleaning with an alkaline cleaning liquid consisting of ammonia, hydrogen peroxide and water in a weight ratio of about 1:1:5 (ammonia:hydrogen peroxide:water).

In order to remove metal impurities adsorbed on the polished surface, cleaning with a cleaning liquid, such as a citric acid aqueous solution, a mixed aqueous solution of hydrofluoric acid and citric acid or a mixed aqueous solution of hydrofluoric acid and ethylenediaminetetraacetic acid (EDTA), can be carried out.

When the chemical mechanical polishing aqueous dispersion of the invention contains organic particles, the organic particles remaining on the polished surface may be removed by heating the polished surface to a high temperature in the presence of oxygen and thereby burning the organic particles on the polished surface.

Examples of the surfaces to be polished, to which the chemical mechanical polishing method of the invention can be applied, include those of a metal layer that is a interconnect material, a barrier metal layer, an insulating layer and a magnetic disc. Examples of metals to constitute the metal layer that is a interconnect material include tungsten, aluminum and copper. Examples of materials to constitute the barrier metal layer include tantalum, titanium, tantalum nitride and titanium nitride. An example of a material to constitute the insulating layer is silicon oxide.

Although the chemical mechanical polishing method of the invention can be applied to surfaces in a wide range as described above, this method can be preferably used for a substance to be polished (polishing target) having a metal layer that is a interconnect material, an insulating layer having an elastic modulus, as measured by nanoindentention method, of not less than 20 GPa and an insulating layer having an elastic modulus, as measured by nanoindentention method, of not less than 1 GPa and less than 20 GPa, and further having a barrier metal layer when needed. In particular, the chemical mechanical polishing method of the invention can be preferably used as a method applied to the case where after an excess metal material is removed (see FIG. 2) in a polishing target having a structure shown in FIG. 1, removal of an excess barrier metal layer and removal of a cap layer are carried out as one process, or as a method applied to the case where after a barrier metal layer is further removed (see FIG. 3), removal of a cap layer is carried out.

FIG. 1 is a schematic view showing a section of a polishing target whose excess metal layer is not removed yet. That is to say, FIG. 1 is a schematic view showing a laminate obtained by forming, on an insulating film material 1 having a low dielectric constant, a stronger insulating layer (cap layer) 2, then forming a trench at the place where a interconnect should be arranged, then forming a barrier metal layer 3 and further depositing a metal layer 4 that is a interconnect material.

Figure 2:
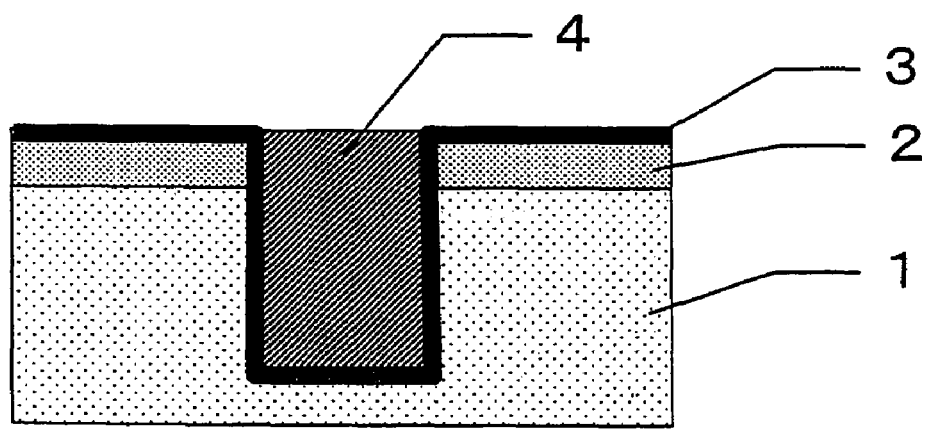
FIG. 2 is a schematic view of a polishing target favorably used in the present invention.

FIG. 2 is a schematic view showing a section of a preferred polishing target for use in the chemical mechanical polishing method of the invention. That is to say, FIG. 2 is a schematic view showing a polishing target for use in the invention, which is obtained by removing an excess metal layer from the polishing target shown in FIG. 1 by the use of an appropriate chemical mechanical polishing aqueous dispersion.

Figure 3:
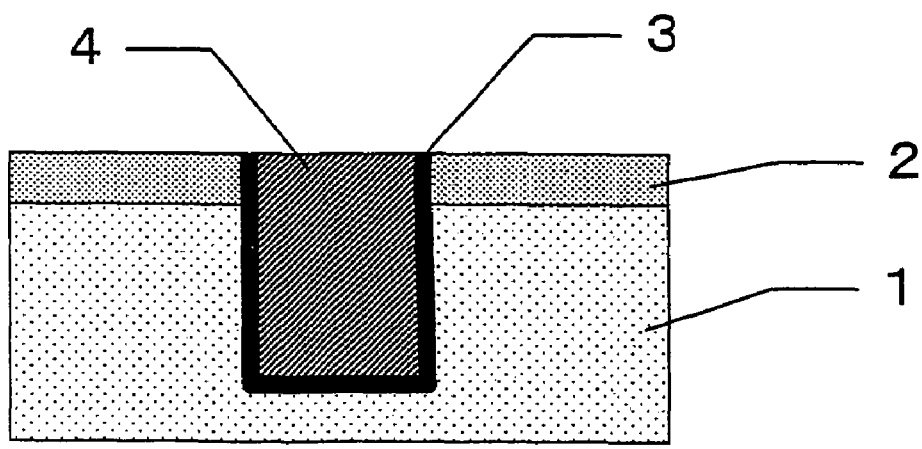
FIG. 3 is a schematic View of a polishing target favorably used in the present invention.

FIG. 3 is a schematic view showing a section of a preferred polishing target for use in the chemical mechanical polishing method of the invention. That is to say, FIG. 3 is a schematic view showing a polishing target for use in the invention, which is obtained by further removing an excess barrier metal layer from the polishing target shown in FIG. 2 by the use of an appropriate chemical mechanical polishing aqueous dispersion.

The chemical mechanical polishing method of the invention can be favorably used in the case where the excess barrier metal layer 3 and the cap layer 2 are removed from the polishing target shown in FIG. 2 as one process. Further, the chemical mechanical polishing method of the invention can be favorably used in the case where after the barrier metal layer is further removed from the polishing target shown in FIG. 2, the cap layer is removed.

Figure 4:
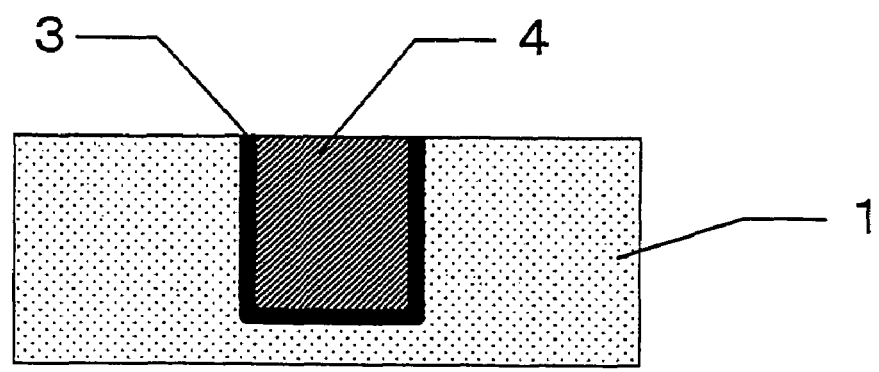
FIG. 4 is a schematic view of a polishing target obtained after a chemical mechanical polishing method of the present invention is carried out.

FIG. 4 is a schematic view of a polished surface obtained after the chemical mechanical polishing method of the invention is performed.

Examples of materials to constitute the metal layer 4 that is a interconnect material include tungsten, aluminum and copper. Of these, copper is preferable. The copper is not limited to pure copper, and for example, a copper alloy (e.g., copper-silicon or copper-aluminum) having a copper content of not less than 95% by weight is also employable.

Examples of materials to constitute the barrier metal layer 3 include tantalum, titanium, tantalum nitride and titanium nitride. Of these, tantalum and/or tantalum nitride is preferable.

Examples of the insulating film materials 1 having low dielectric constant include organic SOG (dielectric constant: about 2.0-2.6), hydrogen-containing SOG (dielectric constant: about 2.8-3.0), a low-dielectric constant material made of an organic polymer (dielectric constant: about 2.2-3.6), a SiOF type low-dielectric constant material (dielectric constant: about 3.3-3.6) and a SiOC type low-dielectric constant material (dielectric constant: about 2.0-3.0). "SOG" is an abbreviation for "spin on glass" and means an insulating film material in the form of a film obtained by applying a precursor onto a substrate and then subjecting it to heat treatment.

The organic SOG is constituted of silicon oxide containing an organic group such as a methyl group and can be obtained by, for example, applying a precursor containing a mixture of tetraethoxysilane and methyltrimethoxysilane onto a substrate and then subjecting it to heat treatment.

The hydrogen-containing SOG is constituted of silicon oxide containing a silicon-hydrogen bond and can be obtained by, for example, applying a precursor containing triethoxysilane or the like onto a substrate and then subjecting it to heat treatment.

The low-dielectric constant material made of an organic polymer is, for example, a low-dielectric constant material containing polyarylene, polyimide, polybenzocyclobutene, polyfluoroethylene or the like as a main constituent.

The SiOF type low-dielectric constant material is constituted of silicon oxide containing a fluorine atom and can be obtained by, for example, adding fluorine to silicon oxide obtained by chemical vapor phase deposition (i.e., doping silicon oxide with fluorine).

The SiOC type low-dielectric constant material is constituted of silicon oxide containing a carbon atom and can be obtained by, for example, chemical vapor phase deposition using a mixture of silicon tetrachloride and carbon monoxide.

Of the above materials, the organic SOG, the hydrogen-containing SOG and the low-dielectric constant material made of an organic polymer may be those having fine pores in the resulting films.

Examples of the commercially available products of the insulating film materials having low dielectric constant include:

as organic SOG, HOSP (dielectric constant: about 2.6, from Honeywell), Nanoglass E (dielectric constant: about 2.2, from Honeywell), Zirkon (dielectric constant: about 2.0, from Shipley) and LKD (dielectric constant: about 2.2, from JSR Corporation.);

as low-dielectric constant materials made of organic polymers containing polyarylene as a main constituent, SiLK (dielectric constant: about 2.6, from Dow Chemical Co.) and p-SiLK (dielectric constant: about 2.2, from Dow Chemical Co.);

as low-dielectric constant materials made of organic polymers containing polyimide as a main constituent, PIQ (dielectric constant: about 2.4-3.6, from Hitachi Chemical Co., Ltd.);

as low-dielectric constant materials made of organic polymers containing polybenzocyclobutene as a main constituent, BCB (dielectric constant: about 2.7, from Dow Chemical Co.); and as SiOC type low-dielectric constant materials, Black Diamond (dielectric constant: about 3.0, from Applied Materials Inc.), Black Diamond II (dielectric constant: about 2.4-2.6, from Applied Materials Inc.), Aurola (dielectric constant: about 2.4-2.6, from ASM International), Coral (dielectric constant: about 2.0-2.8, Novellus Systems, Inc.), Flowfill (dielectric constant: about 2.8, from Tricon Technologies Ltd.) and Orion (dielectric constant: about 2.0, from Tricon Technologies Ltd.).

The above insulating film materials of low dielectric constant have an elastic modulus, as measured by nanoindentention method, of not less than 1 GPa and less than 20 GPa, preferably 1 to 15 GPa.

Examples of materials of the cap layer 2 include a thermal oxidation film, a PETEOS film (plasma enhanced-TEOS film), a HDP film (high density plasma enhanced-TEOS film), a silicon oxide film obtained by a thermal CVD method, a boron phosphorus silicate film (BPSG film) and FSG.

The thermal oxidation film can be formed by exposing high-temperature silicon to an oxidizing atmosphere to subject silicon and oxygen or silicon and moisture to chemical reaction.

The PETEOS film can be formed by chemical vapor phase epitaxy using tetraethyl orthosilicate (TEOS) as a starting material and using plasma as the acceleration conditions.

The HDP film can be formed by chemical vapor phase epitaxy using tetraethyl orthosilicate (TEOS) as a starting material and using high-density plasma as the acceleration conditions.

The silicon oxide film obtained by a thermal CVD method can be formed by an atmospheric pressure CVD method (AP-CVD method) or a low pressure CVD method (LP-CVD method).

The boron phosphorus silicate film (BPSG film) can be formed by an atmospheric pressure CVD method (AP-CVD method) or a low pressure CVD method (LP-CVD method).

The insulating film called FSG can be formed by chemical vapor phase epitaxy using high-density plasma as the acceleration conditions.

The above materials of the cap layer 2 have an elastic modulus, as measured by nanoindentention method, of not less than 20 GPa, preferably 20 to 200 GPa, more preferably 30 to 100 GPa.

The chemical mechanical polishing method of the invention uses the aforesaid chemical mechanical polishing aqueous dispersion of the invention. Therefore, a ratio ($R_{In}/R_{Low-k}$) of a removal rate ($R_{In}$) for polishing an insulating layer having an elastic modulus, as measured by nanoindentention method, of not less than 20 GPa to a removal rate ($R_{Low-k}$) for polishing an insulating layer having an elastic modulus, as measured by nanoindentention method, of not less than 1 GPa and less than 20 GPa can be made large. Further, a ratio ($R_{BM}/R_{Low-k}$) of a removal rate ($R_{BM}$) for polishing a barrier metal layer to a removal rate ($R_{Low-k}$) for polishing an insulating layer having an elastic modulus, as measured by nanoindentention method, of not less than 1 GPa and less than 20 GPa can be also made large. Accordingly, the chemical mechanical polishing method of the invention can be particularly favorably used in the case where the excess barrier metal layer 3 and the cap layer 2 in the polishing target shown in FIG. 2 are removed as one process or in the case where the cap layer 2 in the polishing target shown in FIG. 3 is removed, and the damage to the insulating layer 1 having a low dielectric constant can be reduced.

EFFECT OF THE INVENTION

According to the present invention, a chemical mechanical polishing aqueous dispersion capable of carrying out a chemical mechanical polishing process wherein a barrier metal layer and a cap layer can be efficiently removed by polishing and damage to an insulating film material of a low dielectric constant present in the underlying layer is reduced, and a chemical mechanical polishing method using the chemical mechanical polishing aqueous dispersion are provided.

EXAMPLES

The present invention is further described with reference to the following examples, but it should be construed that the invention is in no way limited to those examples.

(1) Preparation of Aqueous Dispersion Containing Inorganic Particles (1-1) Preparation of Aqueous Dispersion Containing Fumed Silica (1)

Using a planetary kneading machine (trade name: TK HIVIS DISPER MIX, HDM-3D-20 type, manufactured by TOKUSHU KIKA KOGYO Co., Ltd.), 6 kg of fumed silica (available from Nippon Aerosil Co., Ltd., trade name: Aerosil #50, specific surface area as measured by BET method: 52 $m^2/g$) was continuously added to 6 kg of ion-exchanged water over a period of 30 minutes with rotating a main rotating shaft of a twisted blade at 10 rpm and a sub-rotating shaft thereof at 30 rpm and thereby performing kneading. Further, a kneading operation by rotating a main rotating shaft and a sub-rotating shaft of the twisted blade at 10 rpm and at 30 rpm, respectively, and by rotating a main rotating shaft and a sub-rotating shaft of a Korres type high-speed rotor having a diameter of 80 mm at 10 rpm and at 2000 rpm, respectively, was continued for 1 hour.

Thereafter, 0.3108 kg of a 20 wt % potassium hydroxide aqueous solution was added to the resulting mixture to obtain a water dispersion. The water dispersion was diluted with ion-exchanged water to obtain a water dispersion having a silica content of 30% by weight. The water dispersion was filtered through a depth cartridge filter having an pore size of 5 μm to obtain a water dispersion containing fumed silica "FS-1" having an average particle diameter (average secondary particle diameter) of 220 nm.

(1-2) Preparation of Aqueous Dispersion Containing Fumed Silica (2)

Water dispersions containing fumed silica "FS-2", "FS-3", "FS-4" and "FS-5", respectively, were prepared in the same manner as in the process (1-1), except that Aerosil #90, #130, #200 and #300 were respectively used as fumed silica instead of Aerosil #50.

A specific surface area as measured by BET method and an average secondary particle diameter of each fumed silica are as shown in Table 1.

(1-3) Preparation of Aqueous Dispersion Containing Fumed Silica (3)

Using a planetary kneading machine (trade name: TK HIVIS DISPER MIX, HDM-3D-20 type, manufactured by TOKUSHU KIKA KOGYO Co., Ltd.), 6 kg of fumed silica (available from Nippon Aerosil Co., Ltd., trade name: Aerosil #50, specific surface area as measured by BET method: 52 $m^2/g$) was continuously added to 6 kg of ion-exchanged water over a period of 10 minutes with rotating a main rotating shaft of a twisted blade at 10 rpm and a sub-rotating shaft thereof at 30 rpm and thereby performing kneading. Further, a kneading operation by rotating a main rotating shaft and a sub-rotating shaft of the twisted blade at 10 rpm and at 20 rpm, respectively, and by rotating a main rotating-shaft and a sub-rotating shaft of a Korres type high-speed rotor having a diameter of 80 mm at 10 rpm and at 500 rpm, respectively, was continued for 1 hour.

Thereafter, 0.3108 kg of a 20 wt % potassium hydroxide aqueous solution was added to the resulting mixture to obtain a water dispersion. The water dispersion was diluted with ion-exchanged water to obtain a water dispersion having a silica content of 30% by weight. The water dispersion was filtered through a depth cartridge filter having an pore size of 5 μm to obtain a water dispersion containing fumed silica "FS-6" having an average particle diameter (average secondary particle diameter) of 420 nm.

(1-4) Preparation of Aqueous Dispersion Containing Fumed Silica (4)

Using a planetary kneading machine (trade name: TK HIVIS DISPER MIX, HDM-3D-20 type, manufactured by TOKUSHU KIKA KOGYO Co., Ltd.), 6 kg of fumed silica (available from Nippon Aerosil Co., Ltd., trade name: Aerosil #380, specific surface area as measured by BET method: 300 $m^2/g$) was continuously added to 6 kg of ion-exchanged water over a period of 10 minutes with rotating a main rotating shaft of a twisted blade at 10 rpm and a sub-rotating shaft thereof at 30 rpm and thereby performing kneading. Further, a kneading operation by rotating a main rotating shaft and a sub-rotating shaft of the twisted blade at 10 rpm and at 20 rpm, respectively, and by rotating a main rotating shaft and a sub-rotating shaft of a Korres type high-speed rotor having a diameter of 80 mm at 10 rpm and at 500 rpm, respectively, was continued for 1 hour.

Thereafter, 0.3108 kg of a 20 wt % potassium hydroxide aqueous solution was added to the resulting mixture to obtain a water dispersion. The water dispersion was diluted with ion-exchanged water to obtain a water dispersion having a silica content of 20% by weight. The water dispersion was filtered through a depth cartridge filter having an pore size of 5 μm to obtain a water dispersion containing fumed silica "FS-7" having an average particle diameter (average secondary particle diameter) of 230 nm.

TABLE 1

| Type of fumed silica | Specific surface area ($m^2/g$) | Average secondary particle diameter (nm) |
| --- | --- | --- |
| FS-1 | 52 | 220 |
| FS-2 | 90 | 215 |
| FS-3 | 145 | 180 |
| FS-4 | 212 | 131 |
| FS-5 | 307 | 104 |
| FS-6 | 52 | 420 |
| FS-7 | 300 | 230 |

(1-5) Preparation of Aqueous Dispersion Containing Colloidal Silica Particles (1)

In a glass separable flask, 70 parts of ammonia water having a concentration of 25% by weight, 40 parts of ion-exchanged water, 170 parts of ethanol and 20 parts of tetraethoxysilane were placed, and they were heated to 60° C. with stirring at 180 rpm. At this temperature, stirring was continued for 2 hours, and then the mixture was cooled to obtain a colloidal silica particles/ethanol dispersion. Then, an operation of removing ethanol by an evaporator with adding ion-exchanged water at 80° C. was repeated, to remove ethanol from the dispersion and thereby prepare an aqueous dispersion containing 20% by weight of colloidal silica particles "colloidal 1". The colloidal silica "colloidal 1" contained in the aqueous dispersion had an average primary particle diameter of 25 nm and an average secondary particle diameter (dispersed particle diameter) of 40 nm.

(1-6) Preparation of Aqueous Dispersion Containing Colloidal Silica Particles 2 (2)

An aqueous dispersion containing 20% by weight of colloidal silica "colloidal 2" having an average primary particle diameter of 50 nm and an average secondary particle diameter (dispersed particle diameter) of 75 nm was obtained in the same manner as in the process (1-5), except that the amount of ethanol used was changed to 190 parts and the amount of tetraethoxysilane used was changed to 35 parts.

(2) Preparation of Aqueous Dispersion Containing Composite Particles

(2-1) Preparation of Aqueous Dispersion Containing Organic Particles

In a flask, 90 parts of methyl methacrylate, 5 parts of methoxypolyethylene glycol methacrylate (available from Shin-nakamura Kagaku Kogyo K.K., trade name: NK Ester M-90G, # 400), 5 parts of 4-vinylpyridine, 2 parts of an azo type polymerization initiator (available from Wako Junyaku K.K., trade name: V50) and 400 parts of ion-exchanged water were placed, then they were heated to 70° C. in a nitrogen gas atmosphere with stirring, and polymerization was performed for 6 hours. Thus, an aqueous dispersion containing organic particles made of a polymethyl methacrylate type polymer containing a functional group having a cation of an amino group and a polyethylene glycol chain and having an average particle diameter of 150 nm was obtained. Water was added to the aqueous dispersion to dilute it, whereby an aqueous dispersion whose organic particle content had been adjusted to 10% by weight was obtained. The polymerization yield was 95%.

In a flask, 100 parts of the thus obtained aqueous dispersion containing organic particles was placed, then 1 part of methyltrimethoxysilane was added, and they are stirred for 2 hours at 40° C. Thereafter, a 10 wt % nitric acid aqueous solution was added to adjust pH of the dispersion to 2 to obtain an aqueous dispersion (2-1). The organic particles contained in the aqueous dispersion had a zeta-potential of +17 mV.

(2-2) Preparation of Polishing Aqueous Dispersion Containing Inorganic Particles In water, dispersible colloidal silica (available from Nissan Chemical Industries, Ltd., trade name: Snowtex O, average primary particle diameter: 12 nm) was dispersed, and a 10 wt % potassium hydroxide aqueous solution was added to adjust pH, whereby an aqueous dispersion (2-2) containing 10% by weight of colloidal silica and having pH of 8 was obtained. The silica particles contained in the aqueous dispersion had a zeta-potential of −40 mV.

(2-3) Preparation of Composite Particles

With stirring 100 parts of the aqueous dispersion (2-1), 50 parts of the aqueous dispersion (2-2) were slowly added thereto over a period of 2 hours, and they were further stirred for another 2 hours. Then, 2 parts of vinyltriethoxysilane were added to the resulting aqueous dispersion, and they were stirred for 1 hour. Thereafter, 1 part of tetraethoxysilane was added, and the mixture was heated to 60° C., stirred for 3 hours continuously and then cooled to obtain an aqueous dispersion containing 10% by weight of composite particles "composite particles CP" having an average particle diameter of 180 nm. The composite particles were those wherein silica particles adhered to outer surfaces of polymethyl methacrylate type polymer particles so as to cover 80% of the surfaces.

(3) Preparation of Low-Dielectric Constant Insulating film

(3-1) Preparation of Polysiloxane Sol

A solution containing 101.5 g of methyltrimethoxysilane, 276.8 g of methyl methoxypropionate and 9.7 g of a tetraisopropoxytitanium/ethyl acetoacetate complex was heated to 60° C., and a mixture of 92.2 g of γ-butyrolactone and 20.1 g of water was dropwise added to the solution over a period of 1 hour. After the dropwise addition was completed, the mixture was subjected to reaction at 60° C. for 1 hour to obtain a polysiloxane sol.

(3-2) Preparation of Polystyrene Particles

In a flask, 100 parts of styrene, 2 parts of an azo type polymerization initiator (available from Wako Junyaku K.K., trade name: V60), 0.5 part of potassium dodecylbenzenesulfonate and 400 parts of ion-exchanged water were placed, then they were heated to 70° C. in a nitrogen gas atmosphere with stirring, and polymerization was performed for 6 hours to obtain polystyrene particles having an average particle diameter of 150 nm.

(3-3) Preparation of Low-Dielectric Constant Insulating Film 15 g of the polysiloxane sol obtained in the process (3-1) and 1 g of the polystyrene particles obtained in the process (3-2) were mixed, and the mixture was applied onto an 8 inch-diameter silicon substrate with a thermal oxidation film by spin coating to form a coating film. Thereafter, the thus treated substrate was heated in an oven at 80° C. for 5 minutes, subsequently at 200° C. for 5 minutes, then further heated under vacuum at 340° C. for 30 minutes, at 360° C. for 30 minutes, at 380° C. for 30 minutes and at 450° C. for 1 hour to form a colorless transparent film having a thickness of 200 nm.

A section of the film was observed by a scanning electron microscope, and as a result, it was confirmed that a large number of fine pores had been formed.

This film had a dielectric constant of 1.98, an elastic modulus of 3 GPa and a porosity of 15%.

Preparation of Chemical Mechanical Polishing Aqueous Dispersion

In a polyethylene bottle, the aqueous dispersion containing fumed silica "FS-1", which had been prepared in the process (1-1), in an amount of 3 parts by weight in terms of silica contained in this dispersion and the aqueous dispersion containing fumed silica "FS-4", which had been prepared in the process (1-2), in an amount of 3 parts by weight in terms of silica contained in this dispersion were placed. Then, 0.4 part by weight of maleic acid, 0.01 part by weight of potassium dodecylbenzenesulfonate (DBK) and 0.5 part by weight of hydrogen peroxide were added in order, followed by stirring for 15 minutes. Then, pH of the resulting mixture was adjusted to 11.5 by the use of a 10 wt % potassium hydroxide aqueous solution, and ion-exchanged water was added so that the total amount of all the components should be 100 parts by weight. The resulting mixture was filtered through a filter having an pore diameter of 5 μm to obtain a chemical mechanical polishing aqueous dispersion having pH of 11.5.

Test of Chemical Mechanical Polishing Process

Wafers having various films were each loaded in a chemical mechanical polishing apparatus (model: EPO 112, manufactured by Ebara Corporation) and subjected to polishing for 1 minute under the following conditions using the chemical mechanical polishing aqueous dispersion prepared above and using a porous polyurethane polishing pad (available from Rohm & Haas Electronic Materials, product number: IC1000), to evaluate removal rates.

Head rotation speed: 70 rpm
Head load: 250 g/cm$^2$
Table rotation speed: 70 rpm
Aqueous dispersion feed rate: 300 ml/min As the polishing targets for evaluation, the following wafers were used.

(1) Wafer Specimen 1 for Evaluation About Copper film

A wafer wherein a copper film having a film thickness of 1500 nm is formed on an 8 inch-diameter silicon substrate with a thermal oxidation film.

(2) Wafer Specimen 2 for Evaluation About Barrier metal film

A wafer wherein a tantalum nitride film having a film thickness of 150 nm is formed on an 8 inch-diameter silicon substrate with a thermal oxidation film.

(3) Wafer Specimen 3 for Evaluation About Cap Layer

A wafer wherein a PETEOS film having a film thickness of 1000 nm is formed on an 8 inch-diameter silicon substrate.

(4) Wafer Specimen 4 for Evaluation about Low-dielectric Constant Insulating Film A wafer wherein a low-dielectric constant insulating film having a film thickness of 200 nm prepared in the process (3-3) is formed on an 8 inch-diameter silicon substrate with a thermal oxidation film.

The results of polishing the polishing targets are set forth in Tables 2 to 6. The removal rate for each polishing target was determined by measuring film thickness before and after the chemical mechanical polishing process in the following manner and performing calculation using a difference in the thickness and the polishing time.

The thickness of the copper film and the tantalum nitride film was measured before and after the chemical mechanical polishing process by means of an electricity conduction type film thickness measuring device (manufactured by KLA-Tencor Japan Ltd., model: OmniMap RS75). The thickness of the cap layer and the low-dielectric constant insulating film was measured by means of a light interference type film thickness measuring device (manufactured by SENTEC, model: FPT500).

Evaluation of Polishing Target

The polishing targets were evaluated by the presence of peeling of outer periphery of the low-dielectric constant insulating film after the chemical mechanical polishing and by the number of scratches. That is to say, the low-dielectric constant insulating film having been subjected to chemical mechanical polishing in the above manner was cleaned and dried, and then peeling of the outer periphery was observed visually and by an optical microscope.

Further, the whole of the polished surface was observed visually, by an optical microscope and by a foreign matter inspection device for wafer surfaces without pattern (manufactured by KLA-Tencor Japan Ltd., model: Surfscan SP1), and the number of scratches was counted. The results are set forth in Tables 2 to 6.

Examples 2-30, Comparative Examples 1-18

In accordance with the formulations shown in Tables 2 to 6, various chemical mechanical polishing aqueous dispersions were prepared in the same manner as in Example 1. Then, evaluation of chemical mechanical polishing performance of the resulting chemical mechanical polishing aqueous dispersions was carried out in the same manner as in Example 1. The results are set forth in Tables 2 to 6.

In Tables 2 to 6, "BTA", "COOH-BTA" and "OH-BTA" represent benzotriazole, 4-carboxybenzotriazole and 1-hydroxybenzotriazole, respectively. Further, "DBK" and "NONION" represent potassium dodecylbenzenesulfonate and Surfynol 465 (trade name, 2,4,7,9-tetramethyl-5-decyl-4,7-dioldipolyoxyethylene ether, available from Air Products Japan K.K.), respectively. In Tables 5 and 6, "colloidal 1+2" means that a mixture of a given amount of the colloidal silica "colloidal 1" prepared in the process (1-3) and a given amount of the colloidal silica "colloidal 2" prepared in the process (1-4) was used. In the tables, an empty column means that a component corresponding to the column was not added.

TABLE 2

|      |                                      | Ex. 1 | Ex. 2 | Ex. 3 | Ex. 4 |
|------|--------------------------------------|-------|-------|-------|-------|
| (A1) | Type                                 | FS-1  | FS-2  | FS-2  | FS-2  |
|      | Specific surface area (m$^2$/g)      | 52    | 90    | 90    | 90    |
|      | Average secondary particle diameter (nm) | 220 | 215 | 215 | 215 |
|      | Amount (wt %)                        | 3     | 5     | 5     | 5     |
| (A2) | Type                                 | FS-4  | FS-4  | FS-4  | FS-4  |
|      | Specific surface area (m$^2$/g)      | 212   | 212   | 212   | 212   |
|      | Average secondary particle diameter (nm) | 131 | 131 | 131 | 131 |
|      | Amount (wt %)                        | 3     | 3     | 3     | 3     |
| (A3) | Type                                 |       |       |       | composite particle CP |
|      | Average dispersed particle           |       |       |       | 210   |

TABLE 2-continued

|  |  |  |  |  |  |
|---|---|---|---|---|---|
|  | diameter (nm) |  |  |  |  |
|  | Amount (wt %) |  | 1 |  |  |
| (B) | Oxidizing agent Type | Hydrogen peroxide | Hydrogen peroxide | Hydrogen peroxide | Hydrogen peroxide |
|  | Amount (wt %) | 0.5 | 0.5 | 0.3 | 0.3 |
| (C) | Organic acid Type | maleic acid | maleic acid | maleic acid | malonic acid |
|  | Amount (wt %) | 0.4 | 0.4 | 0.3 | 0.2 |
| (D) | Type |  |  |  |  |
|  | Amount (wt %) |  |  |  |  |
| (E) | Surface active agent Type | DBK |  |  | DBK |
|  | Amount (wt %) | 0.01 |  |  | 0.01 |
| pH |  | 11.5 | 10.0 | 10.0 | 10.5 |
| Removal rate (nm/min) | Specimen 1 (copper) | 55 | 42 | 52 | 39 |
|  | Specimen 2 (tantalum nitride) | 73 | 87 | 83 | 72 |
|  | Specimen 3 (cap layer) | 90 | 70 | 82 | 74 |
|  | Specimen 4 (low-dielectric constant insulting film) | 20 | 15 | 8 | 3 |
| Removal rate ratio | $R_{BM}/R_{Low-k}$ | 3.7 | 5.8 | 10.4 | 24.0 |
|  | $R_{In}/R_{Low-k}$ | 4.5 | 4.7 | 10.3 | 24.7 |
| State of a low-dielectric constant insulting film after polishing | Peeling of outer periphery | none | none | none | none |
|  | Number of scratches (scratches/wafer) | 4 | 2 | 0 | 1 |

|  |  | Ex. 5 | Ex. 6 | Ex. 7 |
|---|---|---|---|---|
| (A1) | Type | FS-2 | FS-2 | FS-2 |
|  | Specific surface area (m²/g) | 90 | 90 | 90 |
|  | Average secondary particle diameter (nm) | 215 | 215 | 215 |
|  | Amount (wt %) | 4 | 4 | 4 |
| (A2) | Type | FS-4 | FS-4 | FS-4 |
|  | Specific surface area (m²/g) | 212 | 212 | 212 |
|  | Average secondary particle diameter (nm) | 131 | 131 | 131 |
|  | Amount (wt %) | 4 | 4 | 3 |
| (A3) | Type |  |  | colloidal 1 |
|  | Average dispersed particle diameter (nm) |  |  | 40 |
|  | Amount (wt %) |  |  | 0.5 |
| (B) | Oxidizing agent Type | Hydrogen peroxide | Hydrogen peroxide | Hydrogen peroxide |
|  | Amount (wt %) | 0.5 | 0.5 | 0.5 |
| (C) | Organic acid Type | malonic acid | maleic acid | malonic acid |
|  | Amount (wt %) | 0.2 | 0.3 | 0.2 |
| (D) | Type | quinaldinic acid | BTA |  |
|  | Amount (wt %) | 0.1 | 0.001 |  |
| (E) | Surface active agent Type | NONION | NONION |  |
|  | Amount (wt %) | 0.01 | 0.01 |  |
| pH |  | 11.0 | 11.0 | 11.0 |
| Removal rate (nm/min) | Specimen 1 (copper) | 72 | 16 | 36 |
|  | Specimen 2 (tantalum nitride) | 91 | 69 | 85 |
|  | Specimen 3 (cap layer) | 70 | 75 | 86 |
|  | Specimen 4 (low-dielectric constant insulting film) | 7 | 6 | 12 |
| Removal rate ratio | $R_{BM}/R_{Low-k}$ | 13.0 | 11.5 | 7.08 |
|  | $R_{In}/R_{Low-k}$ | 10.0 | 12.5 | 7.17 |
| State of a low-dielectric constant insulting film after polishing | Peeling of outer periphery | none | none | none |
|  | Number of scratches (scratches/wafer) | 0 | 1 | 1 |

|  |  | Ex. 8 | Ex. 9 | Ex. 10 | Ex. 11 |
|---|---|---|---|---|---|
| (A1) | Type | FS-1 | FS-1 | FS-2 | FS-3 |
|  | Specific surface area (m²/g) | 52 | 52 | 90 | 145 |
|  | Average secondary particle diameter (nm) | 220 | 220 | 215 | 180 |
|  | Amount (wt %) | 2 | 2 | 3 | 2 |
| (A2) | Type | FS-4 | FS-5 | FS-5 | FS-4 |
|  | Specific surface area (m²/g) | 212 | 307 | 307 | 212 |
|  | Average secondary particle diameter (nm) | 131 | 104 | 104 | 131 |
|  | Amount (wt %) | 5 | 5 | 5 | 4 |

TABLE 2-continued

|  |  |  |  |  |  |
|---|---|---|---|---|---|
| (A3) | Type |  |  |  |  |
|  | Average dispersed particle diameter (nm) |  |  |  |  |
|  | Amount (wt %) |  |  |  |  |
| (B) | Oxidizing agent Type | Hydrogen peroxide | Hydrogen peroxide | Hydrogen peroxide | Hydrogen peroxide |
|  | Amount (wt %) | 0.8 | 0.4 | 0.3 | 0.5 |
| (C) | Organic acid Type | malonic acid | maleic acid | malonic acid | maleic acid |
|  | Amount (wt %) | 0.2 | 0.3 | 0.2 | 0.3 |
| (D) | Type |  |  |  | BTA |
|  | Amount (wt %) |  |  |  | 0.005 |
| (E) | Surface active agent Type | DBK | NONION | DBK | NONION |
|  | Amount (wt %) | 0.01 | 0.01 | 0.01 | 0.01 |
| pH |  | 10.0 | 10.5 | 11.0 | 10.5 |
| Removal rate (nm/min) | Specimen 1 (copper) | 42 | 32 | 51 | 15 |
|  | Specimen 2 (tantalum nitride) | 75 | 80 | 98 | 110 |
|  | Specimen 3 (cap layer) | 85 | 68 | 74 | 64 |
|  | Specimen 4 (low-dielectric constant insulting film) | 3 | 2 | 5 | 4 |
| Removal rate ratio | $R_{BM}/R_{Low-k}$ | 25.0 | 40.0 | 19.6 | 27.5 |
|  | $R_{In}/R_{Low-k}$ | 28.3 | 34.0 | 14.8 | 16.0 |
| State of a low-dielectric constant insulting film after polishing | Peeling of outer periphery | none | none | none | none |
|  | Number of scratches (scratches/wafer) | 0 | 1 | 0 | 0 |

TABLE 3

|  |  | Ex. 12 | Ex. 13 | Ex. 14 |
|---|---|---|---|---|
| (A1) | Type | FS-1 | FS-2 | FS-3 |
|  | Specific surface area (m²/g) | 52 | 90 | 145 |
|  | Average secondary particle diameter (nm) | 220 | 215 | 180 |
|  | Amount (wt %) | 3 | 2 | 2 |
| (A2) | Type | FS-4 | FS-4 | FS-4 |
|  | Specific surface area (m²/g) | 212 | 212 | 212 |
|  | Average secondary particle diameter (nm) | 131 | 131 | 131 |
|  | Amount (wt %) | 4 | 3 | 4 |
| (A3) | Type | composite particle CP | colloidal 1 | composite particle CP |
|  | Average dispersed particle diameter (nm) | 210 | 40 | 210 |
|  | Amount (wt %) | 1 | 0.5 | 1 |
| (B) | Oxidizing agent Type | Hydrogen peroxide | Hydrogen peroxide | Hydrogen peroxide |
|  | Amount (wt %) | 0.2 | 0.5 | 0.5 |
| (C) | Organic acid Type | maleic acid | malonic acid | maleic acid |
|  | Amount (wt %) | 0.4 | 0.2 | 0.3 |
| (D) | Type |  |  |  |
|  | Amount (wt %) |  |  |  |
| (E) | Surface active agent Type | DBK | NONION | NONION |
|  | Amount (wt %) | 0.01 | 0.01 | 0.01 |
| pH |  | 11.6 | 10.9 | 10.5 |
| Removal rate (nm/min) | Specimen 1 (copper) | 61 | 31 | 14 |
|  | Specimen 2 (tantalum nitride) | 87 | 79 | 98 |
|  | Specimen 3 (cap layer) | 100 | 78 | 58 |
|  | Specimen 4 (low-dielectric constant insulting film) | 4 | 1 | 1 |
| Removal rate ratio | $R_{BM}/R_{Low-k}$ | 21.8 | 79.0 | 98 |
|  | $R_{In}/R_{Low-k}$ | 25 | 78.0 | 58 |
| State of a low-dielectric constant insulting film after polishing | Peeling of outer periphery | none | none | none |
|  | Number of scratches (scratches/wafer) | 0 | 0 | 0 |

|  |  | Ex. 15 | Ex. 16 | Ex. 17 | Ex. 18 |
|---|---|---|---|---|---|
| (A1) | Type | FS-1 | FS-2 | FS-2 | FS-2 |
|  | Specific surface area (m²/g) | 52 | 90 | 90 | 90 |
|  | Average secondary | 220 | 215 | 215 | 215 |

TABLE 3-continued

|  |  |  |  |  |  |
|---|---|---|---|---|---|
|  | particle diameter (nm) |  |  |  |  |
|  | Amount (wt %) | 3 | 5 | 4 | 4 |
| (A2) | Type | FS-4 | FS-4 | FS-4 | FS-4 |
|  | Specific surface area (m²/g) | 212 | 212 | 212 | 212 |
|  | Average secondary particle diameter (nm) | 131 | 131 | 131 | 131 |
|  | Amount (wt %) | 2 | 2 | 3 | 3 |
| (A3) | Type |  |  | composite particle CP |  |
|  | Average dispersed particle diameter (nm) |  |  | 210 |  |
|  | Amount (wt %) |  |  | 1 |  |
| (B) | Oxidizing agent Type | Hydrogen peroxide | Hydrogen peroxide | Hydrogen peroxide | Hydrogen peroxide |
|  | Amount (wt %) | 0.5 | 0.5 | 0.2 | 0.5 |
| (C) | Organic acid Type | maleic acid | malonic acid | maleic acid | malonic acid |
|  | Amount (wt %) | 0.5 | 0.3 | 0.5 | 0.3 |
| (D) | Type | BTA | BTA | BTA | BTA |
|  | Amount (wt %) | 0.05 | 0.05 | 0.05 | 0.05 |
| (E) | Surface active agent Type |  |  |  |  |
|  | Amount (wt %) |  |  |  |  |
| pH |  | 11.5 | 10.0 | 10.0 | 10.5 |
| Removal rate (nm/min) | Specimen 1 (copper) | 9 | 7 | 6 | 16 |
|  | Specimen 2 (tantalum nitride) | 25 | 30 | 20 | 31 |
|  | Specimen 3 (cap layer) | 75 | 83 | 82 | 110 |
|  | Specimen 4 (low-dielectric constant insulating film) | 20 | 15 | 8 | 12 |
| Removal rate ratio | $R_{BM}/R_{Low-k}$ | 1.3 | 2.0 | 2.5 | 2.6 |
|  | $R_{In}/R_{Low-k}$ | 3.8 | 5.5 | 10.3 | 9.2 |
| State of a low-dielectric constant insulting film after polishing | Peeling of outer periphery | none | none | none | none |
|  | Number of scratches (scratches/wafer) | 4 | 2 | 0 | 1 |

|  |  | Ex. 19 | Ex. 20 | Ex. 21 | Ex. 22 |
|---|---|---|---|---|---|
| (A1) | Type | FS-2 | FS-2 | FS-2 | FS-1 |
|  | Specific surface area (m²/g) | 90 | 90 | 90 | 52 |
|  | Average secondary particle diameter (nm) | 215 | 215 | 215 | 220 |
|  | Amount (wt %) | 4 | 4 | 4 | 2 |
| (A2) | Type | FS-4 | FS-4 | FS-4 | FS-5 |
|  | Specific surface area (m²/g) | 212 | 212 | 212 | 307 |
|  | Average secondary particle diameter (nm) | 131 | 131 | 131 | 104 |
|  | Amount (wt %) | 4 | 3 | 3 | 4 |
| (A3) | Type |  | colloidal 1 | composite particle CP |  |
|  | Average dispersed particle diameter (nm) |  | 40 | 210 |  |
|  | Amount (wt %) |  | 0.5 | 0.5 |  |
| (B) | Oxidizing agent Type | Hydrogen peroxide | Hydrogen peroxide | Hydrogen peroxide | Hydrogen peroxide |
|  | Amount (wt %) | 0.5 | 0.7 | 0.2 | 0.8 |
| (C) | Organic acid Type | maleic acid | maleic acid | maleic acid | malonic acid |
|  | Amount (wt %) | 0.5 | 0.4 | 0.5 | 0.3 |
| (D) | Type | BTA | BTA | COOH-BTA | BTA |
|  | Amount (wt %) | 0.08 | 0.005 | 0.09 | 0.05 |
| (E) | Surface active agent Type |  |  |  |  |
|  | Amount (wt %) |  |  |  |  |
| pH |  | 11.0 | 11.0 | 10.0 | 10.5 |
| Removal rate (nm/min) | Specimen 1 (copper) | 6 | 10 | 12 | 5 |
|  | Specimen 2 (tantalum nitride) | 41 | 85 | 18 | 28 |
|  | Specimen 3 (cap layer) | 89 | 86 | 78 | 86 |
|  | Specimen 4 (low-dielectric constant insulating film) | 7 | 12 | 6 | 20 |
| Removal rate ratio | $R_{BM}/R_{Low-k}$ | 5.9 | 7.1 | 3.0 | 1.4 |
|  | $R_{In}/R_{Low-k}$ | 12.7 | 7.2 | 13.0 | 4.3 |
| State of a low-dielectric constant insulting film after polishing | Peeling of outer periphery | none | none | none | none |
|  | Number of scratches (scratches/wafer) | 0 | 1 | 0 | 1 |

TABLE 4

|  |  | Ex. 23 | Ex. 24 | Ex. 25 | Ex. 26 |
|---|---|---|---|---|---|
| (A1) | Type | FS-2 | FS-1 | FS-2 | FS-3 |
|  | Specific surface area (m$^2$/g) | 90 | 52 | 90 | 145 |
|  | Average secondary particle diameter (nm) | 215 | 220 | 215 | 180 |
|  | Amount (wt %) | 4 | 2 | 3 | 2 |
| (A2) | Type | FS-4 | FS-5 | FS-5 | FS-4 |
|  | Specific surface area (m$^2$/g) | 212 | 307 | 307 | 212 |
|  | Average secondary particle diameter (nm) | 131 | 104 | 104 | 131 |
|  | Amount (wt %) | 3 | 5 | 5 | 4 |
| (A3) | Type | composite particle CP |  |  |  |
|  | Average dispersed particle diameter (nm) | 210 |  |  |  |
|  | Amount (wt %) | 1 |  |  |  |
| (B) | Oxidizing agent Type | Hydrogen peroxide | Hydrogen peroxide | Hydrogen peroxide | Hydrogen peroxide |
|  | Amount (wt %) | 0.2 | 0.5 | 0.5 | 0.3 |
| (C) | Organic acid Type | maleic acid | maleic acid | malonic acid | maleic acid |
|  | Amount (wt %) | 0.5 | 0.5 | 0.3 | 0.5 |
| (D) | Type | OH-BTA | BTA | BTA | BTA |
|  | Amount (wt %) | 0.07 | 0.05 | 0.05 | 0.05 |
| (E) | Surface active agent Type |  |  |  |  |
|  | Amount (wt %) |  |  |  |  |
| pH |  | 10.0 | 9.5 | 10.0 | 10.5 |
| Removal rate (nm/min) | Specimen 1 (copper) | 18 | 10 | 11 | 7 |
|  | Specimen 2 (tantalum nitride) | 22 | 25 | 38 | 55 |
|  | Specimen 3 (cap layer) | 85 | 95 | 100 | 75 |
|  | Specimen 4 (low-dielectric constant insulting film) | 7 | 18 | 13 | 10 |
| Removal rate ratio | $R_{BM}/R_{Low-k}$ | 3.1 | 1.4 | 2.9 | 5.5 |
|  | $R_{In}/R_{Low-k}$ | 12.1 | 5.3 | 7.7 | 7.5 |
| State of a low-dielectric constant insulting film after polishing | Peeling of outer periphery | none | none | none | none |
|  | Number of scratches (scratches/wafer) | 0 | 0 | 0 | 0 |

|  |  | Ex. 27 | Ex. 28 | Ex. 29 |
|---|---|---|---|---|
| (A1) | Type | FS-2 | FS-1 | FS-2 |
|  | Specific surface area (m$^2$/g) | 90 | 52 | 90 |
|  | Average secondary particle diameter (nm) | 215 | 220 | 215 |
|  | Amount (wt %) | 4 | 3 | 4 |
| (A2) | Type | FS-4 | FS-4 | FS-5 |
|  | Specific surface area (m$^2$/g) | 212 | 212 | 307 |
|  | Average secondary particle diameter (nm) | 131 | 131 | 104 |
|  | Amount (wt %) | 3 | 2 | 3 |
| (A3) | Type |  | composite particle CP | colloidal 1 |
|  | Average dispersed particle diameter (nm) |  | 210 | 40 |
|  | Amount (wt %) |  | 1 | 0.5 |
| (B) | Oxidizing agent Type | Hydrogen peroxide | Hydrogen peroxide | Hydrogen peroxide |
|  | Amount (wt %) | 0.1 | 0.3 | 0.3 |
| (C) | Organic acid Type | maleic acid | maleic acid | maleic acid |
|  | Amount (wt %) | 0.5 | 0.5 | 0.5 |
| (D) | Type | BTA | BTA | BTA |
|  | Amount (wt %) | 0.05 | 0.05 | 0.05 |
| (E) | Surface active agent Type | NONION | DBK | NONION |
|  | Amount (wt %) | 0.01 | 0.01 | 0.01 |
| pH |  | 10.2 | 10.5 | 10.5 |
| Removal rate (nm/min) | Specimen 1 (copper) | 15 | 9 | 11 |
|  | Specimen 2 (tantalum nitride) | 41 | 23 | 69 |
|  | Specimen 3 (cap layer) | 65 | 72 | 82 |
|  | Specimen 4 (low-dielectric constant insulting film) | 4 | 5 | 6 |
| Removal rate ratio | $R_{BM}/R_{Low-k}$ | 10.3 | 4.6 | 11.5 |
|  | $R_{In}/R_{Low-k}$ | 16.3 | 14.4 | 13.7 |
| State of a low-dielectric | Peeling of outer periphery | none | none | none |

TABLE 4-continued

| | | | | |
|---|---|---|---|---|
| constant insulting film after polishing | Number of scratches (scratches/wafer) | 0 | 0 | 0 |

| | | Ex. 30 |
|---|---|---|
| (A1) | Type | FS-3 |
| | Specific surface area ($m^2/g$) | 145 |
| | Average secondary particle diameter (nm) | 180 |
| | Amount (wt %) | 2 |
| (A2) | Type | FS-4 |
| | Specific surface area ($m^2/g$) | 212 |
| | Average secondary particle diameter (nm) | 131 |
| | Amount (wt %) | 4 |
| (A3) | Type | composite particle CP |
| | Average dispersed particle diameter (nm) | 210 |
| | Amount (wt %) | 1 |
| (B) | Oxidizing agent Type | Hydrogen peroxide |
| | Amount (wt %) | 0.3 |
| (C) | Organic acid Type | maleic acid |
| | Amount (wt %) | 0.5 |
| (D) | Type | BTA |
| | Amount (wt %) | 0.05 |
| (E) | Surface active agent Type | NONION |
| | Amount (wt %) | 0.01 |
| pH | | 10.5 |
| Removal rate (nm/min) | Specimen 1 (copper) | 9 |
| | Specimen 2 (tantalum nitride) | 51 |
| | Specimen 3 (cap layer) | 71 |
| | Specimen 4 (low-dielectric constant insulting film) | 3 |
| Removal rate ratio | $R_{BM}/R_{Low-k}$ | 17.0 |
| | $R_{In}/R_{Low-k}$ | 23.7 |
| State of a low-dielectric constant insulting film after polishing | Peeling of outer periphery | none |
| | Number of scratches (scratches/wafer) | 0 |

TABLE 5

| | | Comp. Ex. 1 | Comp. Ex. 2 | Comp. Ex. 3 |
|---|---|---|---|---|
| (A1) | Type | FS-1 | FS-2 | FS-2 |
| | Specific surface area ($m^2/g$) | 52 | 90 | 90 |
| | Average secondary particle diameter (nm) | 220 | 215 | 215 |
| | Amount (wt %) | 8 | 10 | 4 |
| (A2) | Type | | | FS-4 |
| | Specific surface area ($m^2/g$) | | | 212 |
| | Average secondary particle diameter (nm) | | | 131 |
| | Amount (wt %) | | | 4 |
| (A3) | Type | | | |
| | Average dispersed particle diameter (nm) | | | |
| | Amount (wt %) | | | |
| (B) | Oxidizing agent Type | Hydrogen peroxide | Hydrogen peroxide | Hydrogen peroxide |
| | Amount (wt %) | 0.5 | 0.5 | 0.5 |
| (C) | Organic acid Type | maleic acid | malonic acid | malonic acid |
| | Amount (wt %) | 0.3 | 0.2 | 0.2 |
| (D) | Type | BTA | quinaldinic acid | quinaldinic acid |
| | Amount (wt %) | 0.001 | 0.1 | 0.1 |

TABLE 5-continued

| | | | | |
|---|---|---|---|---|
| (E) | Surface active agent Type | | | |
| | Amount (wt %) | | | |
| pH | | 11.0 | 11.0 | 13.0 |
| Removal rate (nm/min) | Specimen 1 (copper) | 13 | 89 | 89 |
| | Specimen 2 (tantalum nitride) | 25 | 32 | 65 |
| | Specimen 3 (cap layer) | 150 | 105 | 160 |
| | Specimen 4 (low-dielectric constant insulting film) | 91 | 70 | 220 |
| Removal rate ratio | $R_{BM}/R_{Low-k}$ | 0.3 | 0.5 | 0.3 |
| | $R_{In}/R_{Low-k}$ | 1.9 | 1.5 | 0.7 |
| State of a low-dielectric constant insulting film after polishing | Peeling of outer periphery | observed | observed | none |
| | Number of scratches (scratches/wafer) | 20 | 12 | 7 |

| | | Comp. Ex. 4 | Comp. Ex. 5 | Comp. Ex. 6 |
|---|---|---|---|---|
| (A1) | Type | FS-3 | | |
| | Specific surface area (m²/g) | 145 | | |
| | Average secondary particle diameter (nm) | 180 | | |
| | Amount (wt %) | 8 | | |
| (A2) | Type | | FS-4 | |
| | Specific surface area (m²/g) | | 212 | |
| | Average secondary particle diameter (nm) | | 131 | |
| | Amount (wt %) | | 8 | |
| (A3) | Type | | | colloidal 2 |
| | Average dispersed particle diameter (nm) | | | 75 |
| | Amount (wt %) | | | 5 |
| (B) | Oxidizing agent Type | Hydrogen peroxide | Hydrogen peroxide | Hydrogen peroxide |
| | Amount (wt %) | 0.5 | 0.5 | 0.3 |
| (C) | Organic acid Type | malonic acid | maleic acid | maleic acid |
| | Amount (wt %) | 0.2 | 0.3 | 0.3 |
| (D) | Type | quinaldinic acid | | |
| | Amount (wt %) | 0.1 | | |
| (E) | Surface active agent Type | | | NONION |
| | Amount (wt %) | | | 0.01 |
| pH | | 11.0 | 11.0 | 11.0 |
| Removal rate (nm/min) | Specimen 1 (copper) | 105 | 45 | 32 |
| | Specimen 2 (tantalum nitride) | 43 | 130 | 79 |
| | Specimen 3 (cap layer) | 85 | 45 | 45 |
| | Specimen 4 (low-dielectric constant insulting film) | 60 | 15 | 150 |
| Removal rate ratio | $R_{BM}/R_{Low-k}$ | 0.7 | 8.7 | 0.5 |
| | $R_{In}/R_{Low-k}$ | 1.4 | 3.0 | 0.3 |
| State of a low-dielectric constant insulting film after polishing | Peeling of outer periphery | observed | none | observed |
| | Number of scratches (scratches/wafer) | 22 | 32 | 100 or more |

| | | Comp. Ex. 7 | Comp. Ex. 8 | Comp. Ex. 9 |
|---|---|---|---|---|
| (A1) | Type | | FS-1 | FS-2 |
| | Specific surface area (m²/g) | | 52 | 90 |
| | Average secondary particle diameter (nm) | | 220 | 215 |
| | Amount (wt %) | | 7 | 7 |
| (A2) | Type | | | |
| | Specific surface area (m²/g) | | | |
| | Average secondary particle diameter (nm) | | | |
| | Amount (wt %) | | | |
| (A3) | Type | colloidal 1 + 2 | | |
| | Average dispersed particle diameter (nm) | 40, 75 | | |
| | Amount (wt %) | 3 + 3 | | |
| (B) | Oxidizing agent Type | Hydrogen peroxide | Hydrogen peroxide | Hydrogen peroxide |
| | Amount (wt %) | 0.3 | 0.5 | 0.5 |

TABLE 5-continued

| (C) | Organic acid Type | maleic acid | maleic acid | malonic acid |
|---|---|---|---|---|
|  | Amount (wt %) | 0.3 | 0.5 | 0.4 |
| (D) | Type |  | BTA | BTA |
|  | Amount (wt %) |  | 0.05 | 0.05 |
| (E) | Surface active agent Type | NONION |  |  |
|  | Amount (wt %) | 0.01 |  |  |
| pH |  | 11.0 | 10.0 | 11.0 |
| Removal rate (nm/min) | Specimen 1 (copper) | 27 | 13 | 9 |
|  | Specimen 2 (tantalum nitride) | 32 | 25 | 32 |
|  | Specimen 3 (cap layer) | 20 | 150 | 105 |
|  | Specimen 4 (low-dielectric constant insulting film) | 100 | 91 | 70 |
| Removal rate ratio | $R_{BM}/R_{Low-k}$ | 0.3 | 0.3 | 0.5 |
|  | $R_{In}/R_{Low-k}$ | 0.2 | 1.6 | 1.5 |
| State of a low-dielectric constant insulting film after polishing | Peeling of outer periphery | observed | observed | observed |
|  | Number of scratches (scratches/wafer) | 100 or more | 20 | 12 |

TABLE 6

|  |  | Comp. Ex. 10 | Comp. Ex. 11 | Comp. Ex. 12 | Comp. Ex. 13 |
|---|---|---|---|---|---|
| (A1) | Type | FS-2 |  | FS-3 |  |
|  | Specific surface area (m²/g) | 90 |  | 145 |  |
|  | Average secondary particle diameter (nm) | 215 |  | 180 |  |
|  | Amount (wt %) | 4 |  | 8 |  |
| (A2) | Type | FS-4 | FS-4 |  |  |
|  | Specific surface area (m²/g) | 212 | 212 |  |  |
|  | Average secondary particle diameter (nm) | 131 | 131 |  |  |
|  | Amount (wt %) | 4 | 8 |  |  |
| (A3) | Type |  |  |  | colloidal 2 |
|  | Average dispersed particle diameter (nm) |  |  |  | 75 |
|  | Amount (wt %) |  |  |  | 5 |
| (B) | Oxidizing agent Type | Hydrogen peroxide | Hydrogen peroxide | Hydrogen peroxide | Hydrogen peroxide |
|  | Amount (wt %) | 0.5 | 0.5 | 0.5 | 0.3 |
| (C) | Organic acid Type | maleic acid | maleic acid | malonic acid | maleic acid |
|  | Amount (wt %) | 0.5 | 0.5 | 0.2 | 0.5 |
| (D) | Type | BTA | BTA | BTA | BTA |
|  | Amount (wt %) | 0.05 | 0.05 | 0.09 | 0.05 |
| (E) | Surface active agent Type |  |  |  |  |
|  | Amount (wt %) |  |  |  |  |
| pH |  | 13.0 | 11.0 | 12.0 | 10.0 |
| Removal rate (nm/min) | Specimen 1 (copper) | 12 | 6 | 2 | 13 |
|  | Specimen 2 (tantalum nitride) | 51 | 130 | 32 | 79 |
|  | Specimen 3 (cap layer) | 130 | 45 | 95 | 45 |
|  | Specimen 4 (low-dielectric constant insulting film) | 210 | 15 | 185 | 150 |
| Removal rate ratio | $R_{BM}/R_{Low-k}$ | 0.2 | 8.7 | 0.2 | 0.5 |
|  | $R_{In}/R_{Low-k}$ | 0.6 | 3.0 | 0.5 | 0.3 |
| State of a low-dielectric constant insulting film after polishing | Peeling of outer periphery | none | none | observed | observed |
|  | Number of scratches (scratches/wafer) | 5 | 32 | 22 | 100 or more |

|  |  | Comp. Ex. 14 | Comp. Ex. 15 | Comp. Ex. 16 |
|---|---|---|---|---|
| (A1) | Type |  | FS-6 | FS-2 |
|  | Specific surface area (m²/g) |  | 52 | 90 |
|  | Average secondary particle diameter (nm) |  | 420 | 215 |
|  | Amount (wt %) |  | 4 | 4 |
| (A2) | Type |  | FS-4 | FS-7 |
|  | Specific surface area (m²/g) |  | 212 | 300 |
|  | Average secondary |  | 131 | 230 |

TABLE 6-continued

|   |   |   |   |   |
|---|---|---|---|---|
| | particle diameter (nm) | | | |
| | Amount (wt %) | | 4 | 4 |
| (A3) | Type | colloidal | | |
| | | 1 + 2 | | |
| | Average dispersed particle diameter (nm) | 40, 75 | | |
| | Amount (wt %) | 3 + 3 | | |
| (B) | Oxidizing agent Type | Hydrogen peroxide | Hydrogen peroxide | Hydrogen peroxide |
| | Amount (wt %) | 0.5 | 0.5 | 0.5 |
| (C) | Organic acid Type | maleic acid | malonic acid | malonic acid |
| | Amount (wt %) | 0.5 | 0.2 | 0.2 |
| (D) | Type | BTA | | |
| | Amount (wt %) | 0.05 | | |
| (E) | Surface active agent Type | | DBK | DBK |
| | Amount (wt %) | | 0.01 | 0.01 |
| pH | | 10.0 | 10.5 | 10.5 |
| Removal rate (nm/min) | Specimen 1 (copper) | 18 | 53 | 48 |
| | Specimen 2 (tantalum nitride) | 56 | 85 | 65 |
| | Specimen 3 (cap layer) | 32 | 75 | 72 |
| | Specimen 4 (low-dielectric constant insulting film) | 120 | 95 | 85 |
| Removal rate ratio | $R_{BM}/R_{Low-k}$ | 0.5 | 0.9 | 0.8 |
| | $R_{In}/R_{Low-k}$ | 0.3 | 0.8 | 0.8 |
| State of a low-dielectric constant insulting film after polishing | Peeling of outer periphery | observed | observed | observed |
| | Number of scratches (scratches/wafer) | 100 or more | 58 | 35 |

|   |   | Comp. Ex. 17 | Comp. Ex. 18 |
|---|---|---|---|
| (A1) | Type | FS-6 | FS-7 |
| | Specific surface area (m$^2$/g) | 52 | 300 |
| | Average secondary particle diameter (nm) | 420 | 230 |
| | Amount (wt %) | 4 | 4 |
| (A2) | Type | FS-7 | FS-4 |
| | Specific surface area (m$^2$/g) | 300 | 212 |
| | Average secondary particle diameter (nm) | 230 | 131 |
| | Amount (wt %) | 4 | 4 |
| (A3) | Type | | |
| | Average dispersed particle diameter (nm) | | |
| | Amount (wt %) | | |
| (B) | Oxidizing agent Type | Hydrogen peroxide | Hydrogen peroxide |
| | Amount (wt %) | 0.5 | 0.5 |
| (C) | Organic acid Type | malonic acid | malonic acid |
| | Amount (wt %) | 0.2 | 0.2 |
| (D) | Type | | |
| | Amount (wt %) | | |
| (E) | Surface active agent Type | DBK | DBK |
| | Amount (wt %) | 0.01 | 0.01 |
| pH | | 11.0 | 10.5 |
| Removal rate (nm/min) | Specimen 1 (copper) | 72 | 35 |
| | Specimen 2 (tantalum nitride) | 92 | 58 |
| | Specimen 3 (cap layer) | 85 | 52 |
| | Specimen 4 (low-dielectric constant insulting film) | 210 | 80 |
| Removal rate ratio | $R_{BM}/R_{Low-k}$ | 0.4 | 0.7 |
| | $R_{In}/R_{Low-k}$ | 0.4 | 0.7 |
| State of a low-dielectric constant insulting film after polishing | Peeling of outer periphery | observed | observed |
| | Number of scratches (scratches/wafer) | 81 | 81 |

From the results set forth in the tables, it can be seen that when the aqueous dispersions of Comparative Examples 1, 2, 4, 8 and 9 each containing only one kind of fumed silica were used, the removal rate for polishing the low-dielectric constant layer-insulating film was excessively high, and only one of the barrier metal film and the cap layer could be polished at a satisfactory removal rate. It can be also seen that the aqueous dispersions of Comparative Examples 5 and 11 were poor in the removal rate for polishing the cap layer. In case of Comparative Examples 6 and 7 each containing no fumed silica and Comparative Example 3 having pH of more than 12, the removal rate for polishing the low-dielectric constant layer-insulating film was excessively high. In addition, it can be seen that in any of the comparative examples, many scratches occurred on the surface of the low-dielectric constant insulating film.

On the other hand, it can be seen that according to Examples 1 to 30 each of which was a chemical mechanical polishing aqueous dispersion of the invention, a sufficiently high removal rate was obtained for the barrier metal film and the cap layer, and the removal rate for the low-dielectric constant insulating film was held down to a low level. Moreover, it can be seen that when these chemical mechanical polishing aqueous dispersions were used, scratches did not occur at all or hardly occurred.

What is claimed is:

1. A chemical mechanical polishing aqueous dispersion comprising:
   (A1) first fumed silica having a specific surface area of not less than 10 m$^2$/g and less than 160 m$^2$/g and an average secondary particle diameter of not less than 170 nm and not more than 250 nm, and
   (A2) second fumed silica having a specific surface area of not less than 160 m$^2$/g and an average secondary particle diameter of not less than 50 nm and less than 170 nm,
   said aqueous dispersion having pH of not less than 3 and not more than 12.

2. The chemical mechanical polishing aqueous dispersion as claimed in claim 1, further comprising:
   (E) organic-inorganic composite particles and/or colloidal silica.

3. The chemical mechanical polishing aqueous dispersion as claimed in claim 1, wherein a compounding ratio by weight between the first fumed silica (A1) and the second fumed silica (A2) is in the range of 1:2 to 5:1.

4. A chemical mechanical polishing method comprising chemically and mechanically polishing a polishing target by the use of the chemical mechanical polishing aqueous dispersion of claim 1, said polishing target having:
   a metal layer that is a interconnect material,
   a barrier metal layer,
   an insulating layer having an elastic modulus, as measured by nanoindentention method, of not less than 20 GPa, and
   an insulating layer having an elastic modulus, as measured by nanoindentention method, of not less than 1 GPa and less than 20 GPa.

5. The chemical mechanical polishing aqueous dispersion as claimed in claim 1, further comprising:
   (B) an oxidizing agent, and
   (C) an organic acid (except a carboxylic acid having benzotriazole skeleton, quinoline skeleton or pyridine skeleton).

6. The chemical mechanical polishing aqueous dispersion as claimed in claim 5, further comprising:
   (D) at least one compound selected from the group consisting of benzotriazole, a benzotriazole derivative, quinolinecarboxylic acid, a quinolinecarboxylic acid derivative, pyridinecarboxylic acid and a pyridinecarboxylic acid derivative.

7. The chemical mechanical polishing aqueous dispersion as claimed in claim 1, having properties that in the case where (1) an insulating layer having an elastic modulus, as measured by nanoindentention method, of not less than 20 GPa and (2) an insulating layer having an elastic modulus, as measured by nanoindentention method, of not less than 1 GPa and less than 20 GPa are each subjected to chemical mechanical polishing by the use said aqueous dispersion under the same conditions, a ratio ($R_{In}/R_{Low-k}$) of a removal rate ($R_{In}$) for polishing the insulating layer (1) to a removal rate ($R_{Low-k}$) for polishing the insulating layer (2) exceeds 1.

8. The chemical mechanical polishing aqueous dispersion as claimed in claim 7, having properties that in the case where a barrier metal layer is subjected to chemical mechanical polishing by the use of said aqueous dispersion under the same conditions as for the insulating layer (1) and the insulating layer (2), a ratio ($R_{BM}/R_{Low-k}$) of a removal rate ($R_{BM}$) for polishing the barrier metal layer to a removal rate ($R_{Low-k}$) for polishing the insulating layer (2) exceeds 1.

* * * * *